United States Patent
Anthony et al.

(10) Patent No.: US 7,027,319 B2
(45) Date of Patent: Apr. 11, 2006

(54) RETRIEVING DATA STORED IN A MAGNETIC INTEGRATED MEMORY

(75) Inventors: Thomas C. Anthony, Sunnyvale, CA (US); Richard L. Hilton, Boise, ID (US); Lung T. Tran, Saratoga, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 43 days.

(21) Appl. No.: 10/465,714

(22) Filed: Jun. 19, 2003

(65) Prior Publication Data

US 2004/0257862 A1 Dec. 23, 2004

(51) Int. Cl.
*G11C 11/00* (2006.01)

(52) U.S. Cl. ............ 365/158; 365/48; 365/55; 365/66; 365/97; 365/173

(58) Field of Classification Search ......... 365/158, 365/173, 209, 214, 225.5, 48, 55, 66, 97, 365/171
See application file for complete search history.

(56) References Cited

U.S. PATENT DOCUMENTS

| | | | |
|---|---|---|---|
| 3,331,064 A * | 7/1967 | Hewitt | 365/129 |
| 4,031,525 A * | 6/1977 | Volz et al. | 365/133 |
| 4,639,806 A * | 1/1987 | Kira et al. | 360/327.32 |
| 4,878,140 A * | 10/1989 | Gill et al. | 360/315 |
| 5,920,500 A * | 7/1999 | Tehrani et al. | 365/173 |
| 5,929,636 A * | 7/1999 | Torok et al. | 324/252 |
| 6,266,289 B1 * | 7/2001 | Dubovik et al. | 365/213 |
| 6,477,077 B1 | 11/2002 | Okazawa | |
| 6,480,411 B1 * | 11/2002 | Koganei | 365/158 |
| 6,498,747 B1 | 12/2002 | Gogl et al. | |
| 6,507,187 B1 * | 1/2003 | Olivas et al. | 324/207.21 |
| 6,856,565 B1 * | 2/2005 | Ooishi et al. | 365/210 |
| 6,925,002 B1 * | 8/2005 | Schwarzl | 365/158 |
| 2003/0179510 A1 * | 9/2003 | Hayakawa | 360/324.1 |
| 2004/0047179 A1 * | 3/2004 | Tanizaki et al. | 365/171 |
| 2004/0066668 A1 * | 4/2004 | Gider et al. | 365/171 |
| 2004/0130940 A1 * | 7/2004 | Huai et al. | 365/173 |
| 2004/0141365 A1 * | 7/2004 | Perner et al. | 365/158 |

* cited by examiner

Primary Examiner—Amir Zarabian
Assistant Examiner—Ly Duy Pham

(57) ABSTRACT

Methods and apparatuses are disclosed for retrieving data stored in a magnetic integrated memory. In one embodiment, the method includes applying a perturbing hard-axis magnetic field to a magnetic element in a magnetic integrated memory and detecting a change in an electrical parameter caused by said perturbing hard-axis magnetic field.

15 Claims, 3 Drawing Sheets

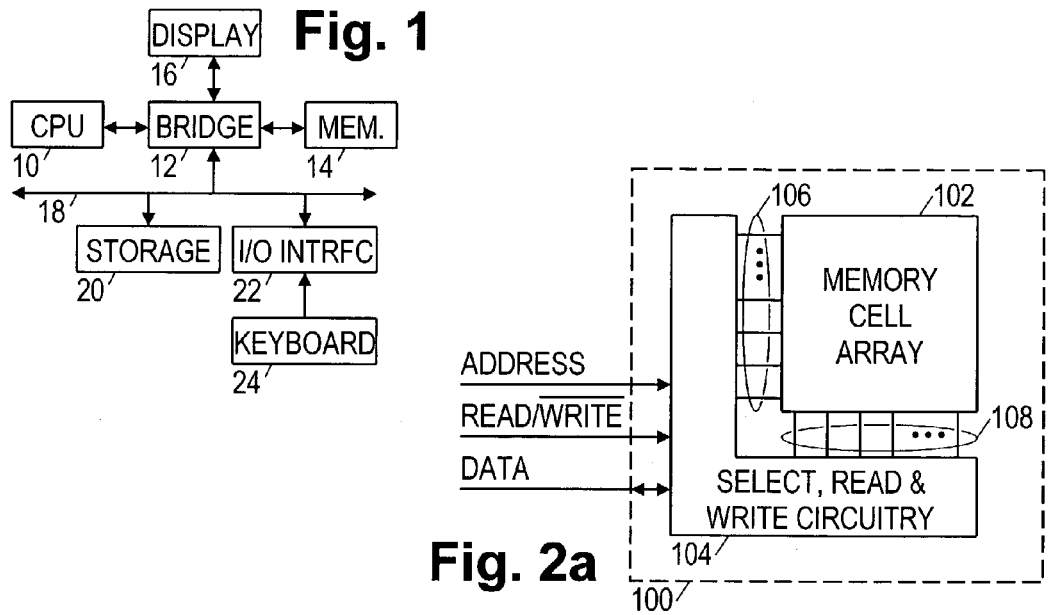
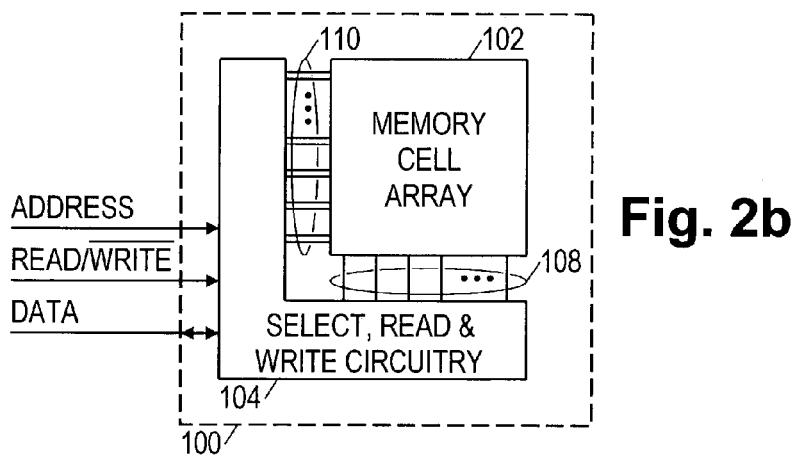
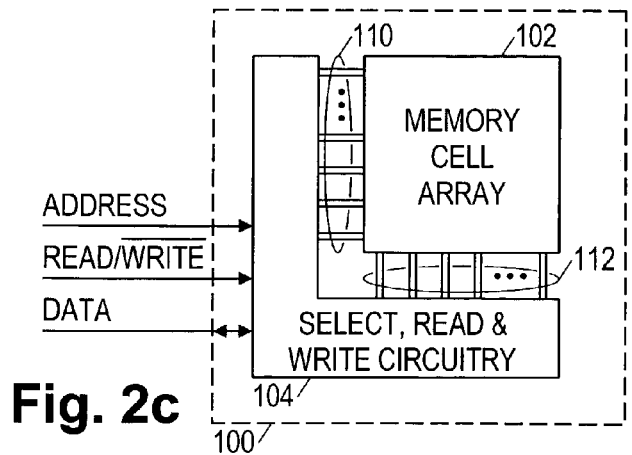

RETRIEVING DATA STORED IN A MAGNETIC INTEGRATED MEMORY

BACKGROUND

Information is extremely valuable for modern development and progress, especially in the development of new technology. However, many ways of storing and preserving information do not allow easy access to it. For example, information may be stored in library books, but identifying and obtaining the correct book often requires significant effort. Costs associated with accessing stored information may reduce the effective value of the information.

Many developing technologies have been embraced because they increase accessibility to information. Microfilm, magnetic tapes, magnetic disk media, optical disk media, and non-volatile integrated memories are examples of technologies that have increased accessibility to information stored on them. Non-volatile integrated memories are of particular interest here.

Integrated memories are electrical circuits that are configured to store information in digital form. This digital information, or "data," is readily accessible to a digital device appropriately coupled to the integrated memory. Depending on the particular technology employed, data can be accessed at truly astonishing rates.

Not all integrated memories are non-volatile. Volatile integrated memories suffer loss of stored data in the absence of electrical power. In the past, this shortcoming has been offset by the high rate of access to the data.

Magnetic integrated memories, as that term is used herein, are integrated memories that use magnetization states to store data. Magnetic materials can be given magnetization states (e.g., magnetic orientations) that do not rely on the continued presence of electrical power to preserve the magnetization state. A variety of sensing techniques may be employed to detect magnetization states in these memories and to determine the data these states represent.

One issue with the current technology for these memories is non-uniformity. A given portion of a magnetic integrated memory may have characteristics that vary from another portion of the memory. These characteristics may relate to the strength of the stored magnetization and to the sensitivity of sensing configurations. Accordingly, a sense signal that indicates stored magnetization characteristics is expected to exhibit position-dependent variation.

One proposed method for dealing with the position-dependent variation makes use of the reproducibility of the variation. The proposed method involves multiple measurements: a measurement of the original sense signal associated with a storage location; and a measurement of the original sense signal after known data value is placed in the storage location. This second measurement is repeated for each possible data value. The known data value having a sense signal "closest" to the original sense signal is identified as the stored data value.

Because this method involves replacing the originally stored data with known data, it is often called a "destructive read." Destructive read methods require numerous operations on the storage location. A read method that accommodates position-dependent variation while requiring fewer operations may offer higher access rates.

BRIEF SUMMARY

Accordingly, methods and apparatuses are disclosed for retrieving data stored in a magnetic integrated memory. In one embodiment, the method comprises: a) applying a perturbing hard-axis magnetic field to a magnetic element in a magnetic integrated memory; and b) detecting a change in an electrical parameter caused by said perturbing hard-axis magnetic field.

BRIEF DESCRIPTION OF THE DRAWINGS

For a detailed description of exemplary embodiments, reference will now be made to the accompanying drawings in which:

FIG. 1 shows a computer system in which certain embodiments may be employed;

FIGS. 2a–2c show examples of magnetic integrated memory architectures in accordance with certain embodiments;

NOTATION AND NOMENCLATURE

Figure 3A:
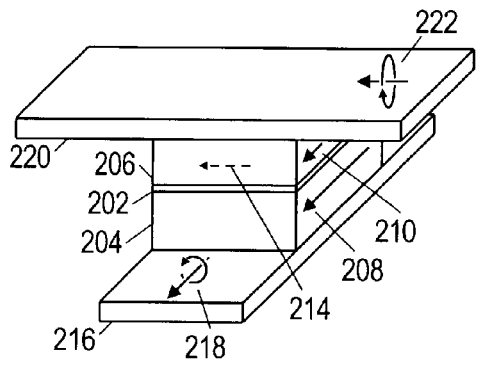
FIGS. 3a–3b show examples of magnetic tunneling junction (MTJ) memory elements in accordance with certain embodiments.

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct electrical connection. Thus, if a first device couples to a second device, that connection may be through a direct electrical connection, or through an indirect electrical connection via other devices and connections.

DETAILED DESCRIPTION

The drawings and following discussion are directed to various embodiments. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

FIG. 1 shows a computer system, an example of where a magnetic memory may be employed. The computer system of FIG. 1 includes a central processing unit (CPU) 10 coupled by a bridge 12 to a system memory 14 and a display 16. CPU 10 is further coupled by bridge 12 to an expansion bus 18. Also coupled to the expansion bus 18 are a storage device 20 and an input/output interface 22. A keyboard 24 may be coupled to the computer via input/output interface 22.

CPU 10 may operate in accordance with software stored in memory 14 and/or storage device 20. Under the direction of the software, the CPU 10 may accept commands from an operator via keyboard 24 or some alternative input device, and may display desired information to the operator via display 16 or some alternative output device. CPU 10 may control the operations of other system components to retrieve, transfer, and store data.

Bridge 12 coordinates the flow of data between components. Bridge 12 may provide dedicated, high-bandwidth, point-to-point buses for CPU 10, memory 14, and display 16.

Memory 14 may store software and data for rapid access. Memory 14 may be magnetic integrated memory. Alternatively, memory 14 may be volatile integrated memory.

Display 16 may provide data for use by an operator. Display 16 may further provide graphics and may include advanced graphics processing capabilities.

Expansion bus 18 may support communications between bridge 12 and multiple other computer components. Bus 18 may couple to removable modular components and/or components integrated onto a circuit board with bridge 12 (e.g., audio cards, network interfaces, data acquisition modules, or modems).

Storage device 20 may store software and data for long-term preservation. Storage device 20 may be portable, or may accept removable media, or may be an installed component, or may be a integrated component on the circuit board. Storage device 20 may be magnetic integrated memory. Alternatively, storage device 20 may be a nonvolatile integrated memory, a magnetic media storage device, an optical media storage device, or some other form of long-term information storage.

Input/output interface 22 may support communications with legacy components and devices not requiring a high-bandwidth connection. Input/output interface 22 may further include a real-time clock and may support communications with scan chains for low-level testing of the system.

Keyboard 24 may provide data in response to operator actuation. Other input devices (e.g., pointing devices, buttons, or sensors) may also be coupled to input/output interface 22 to provide data in response to operator actuation. Output devices (e.g., parallel ports, serial ports, printers, speakers, or lights) may also be coupled to input/output interface 22 to communicate information to the operator.

In addition to the above-described system, many other general purpose and customized digital devices and systems may beneficially employ magnetic integrated memories.

FIG. 2a shows a first architecture for a magnetic integrated memory 100. Memory 100 includes a memory cell array 102 and support circuitry 104. Memory cell array 102, as the name suggests, is an array of cells (see, e.g., FIG. 5a). Each cell can store a data value (e.g., a bit), and may be identified by its position (e.g., by row and column coordinate).

Support circuitry 104 may receive an address signal, a read/write signal, and a data signal. The address signal may represent an address value as a binary number. Each address value may be associated with one or more cells in the memory array. For example, each cell may be associated with a unique address value. As an alternative example, each address value may be associated with a corresponding ordered set of 64 cells.

The read/write signal may be a signal with at least two values, one value being the "asserted" state, and the other value being the "de-asserted" state. In the asserted state, the read/write signal may cause a read operation to occur, in which data is retrieved from the memory cell array 102. In the de-asserted state, the read/write signal may cause a write operation to occur, in which data is stored in the memory cell array.

The data signal may represent a data value as a binary number. The data signal may be bi-directional so that it may be received by the support circuitry 104 during a read operation, and may be provided by the support circuitry 104 during a write operation. Although the address, read/write, and data signals are shown separately, they may be multiplexed with each other and/or multiplexed with other signals.

Figure 5A:
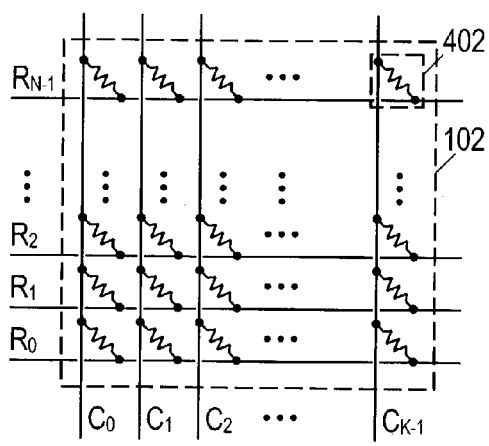
FIGS. 5a–5c show examples of electrical models of certain memory cell array embodiments.

Support circuitry 104 may be coupled to memory cell array 102 by row lines 106 and column lines 108. Depending on the memory cell architecture, data may be retrieved from memory cell(s) associated with an address by asserting a row line associated with the address and de-asserting all the other row lines. The data may be available as a voltage or current signal on the column line(s) associated with the address value. Alternatively, data may be sequentially retrieved from the memory cell(s) associated with an address by selectively passing individual currents through the cell(s). These methods will be described in greater detail when FIG. 5a is discussed below.

Support circuitry 104 may store data in memory cell(s) associated with an address by simultaneously passing currents through associated row and column lines. When multiple cells are associated with an address value, the data storage in the cells may be performed sequentially or in parallel, depending on the cell architecture.

FIG. 2b shows a second architecture for magnetic integrated memory 100. This embodiment has a "three conductor" architecture in which the support circuitry 104 is coupled to memory cell array 102 by pairs of row lines 110 and single column lines 108. One of the row lines in each pair (the "row sense" line) may be used for establishing direct electrical contact with storage element(s) in associated memory cell(s). The other row line in each pair (the "row affect" line) may be used for establishing magnetic coupling with the storage element(s) in associated memory cell(s). During read operations, both row lines may be used simultaneously to achieve a non-destructive read operation that is insensitive to memory cell variations.

FIG. 2c shows a third architecture for magnetic integrated memory 100. This embodiment has a "four conductor" architecture in which the support circuitry 104 is coupled to memory cell array 102 by column line pairs 112 as well as by row line pairs 110. As with the row line pairs, the column line pairs may include a line for direct electrical contact (the "column sense" line) and a line for magnetic coupling (the "column affect" line).

Many types of memory cells may be suitable for use in memory cell array 102. FIG. 3a shows one example in idealized form: a magnetic tunnel junction (MTJ). The MTJ may be formed by placing a thin nonconductive layer 202 between a conductive hard magnetic layer 204 and a conductive soft magnetic layer 206. When a voltage is established between the magnetic layers 204 and 206, current carriers "tunnel" through the nonconductive layer 202. Accordingly, the MTJ structure electrically resembles a resistor.

Figure 3B:
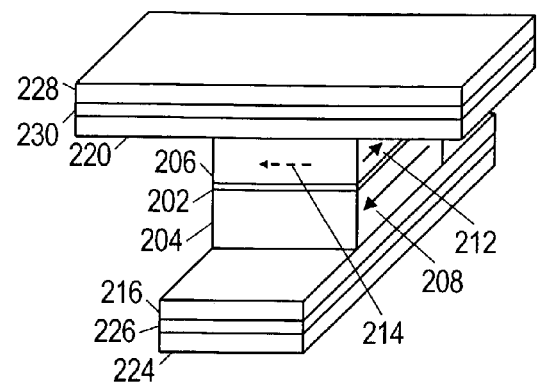

Importantly, the MTJ resistance may be adjusted. When the orientations of the magnetic layers 204 and 206 are aligned (parallel) as shown by arrows 208 and 210, the resistance is lower than when the orientations are opposed (anti-parallel) as shown by arrows 208 and 212 (FIG. 3*b*).

With respect to magnetic materials, the terms "hard" and "soft" connote relatively high and low magnetic coercivities, respectively. A soft magnetic material can be oriented by a weaker magnetic field than can a hard magnetic material. Thus, soft magnetic layer 206 can be re-oriented without altering the orientation of hard magnetic layer 204, simply by not allowing the magnetic field to exceed the critical level required for re-orienting the hard magnetic layer.

Another factor that determines the orientation of the magnetic layers is the "easy axis." Each of the layers may have an axis of preferential orientation along which less of a magnetic field is required to orient the layer, and along which the persistent magnetization of the layer will point (e.g., arrows 208, 210, 212). Such an axis may be established by the geometry of the layer and/or by a crystalline orientation of the layer and/or by providing an anti-ferromagnetic layer for exchange biasing. Axes perpendicular to the easy axis are "hard" axes, and may require much higher fields to establish a persistent orientation. In some cases, magnetization along these axes may not be stable.

Arrow 214 shows a field along a hard axis of the soft magnetic layer 206. Such a field may be established by passing a current along conductor 216 as shown by arrows 218. Current flowing in conductor 216 creates a circular magnetic field around the conductor in accordance with the "right hand rule." A current flowing in conductor 216 may make soft magnetic layer 206 more susceptible to re-orientation by a magnetic field along its easy axis. Such a field may be provided by a current flowing through conductor 220 as shown by arrows 222. Current flowing in the direction shown may orient the soft magnetic layer 206 as shown by arrow 210. A current flowing in the opposite direction through conductor 220 while current flows in conductor 216 may orient the soft magnetic layer as shown by arrow 212 (FIG. 3*b*). Thus currents flowing through a row line 106 and column line 108 (FIG. 2*a*) may store information by appropriately orienting a magnetic layer at the intersection of the row and column lines.

Conductors 216 and 220 may be in electrical contact through the MTJ. A parallel orientation of layers in the MTJ (arrows 208 and 210 in FIG. 3*a*) may be detected as a (relatively) low resistance between conductors 216 and 220, while an anti-parallel orientation (arrows 208 and 212 in FIG. 3*b*) may be detected as a (relatively) high resistance between these conductors.

However, position-dependent variation of memory cell characteristics may make it difficult to determine when a measured resistance value is high or low without using destructive read techniques. As an alternative, the resistance state of the memory cell may be detected by measuring a change in resistance caused by placing a perturbing hard axis field across the MTJ, e.g., in the direction shown by arrow 214.

A transient hard-axis field may temporarily alter the effective orientation of the magnetic layers 204 and 206, partially and temporarily "rotating" their orientations in the direction of the transient field. (The rotations for the different layers may be unequal.) For MTJs in the anti-parallel orientation state, this rotation may decrease the resistance value since the layer orientations are "less" anti-parallel. For MTJs in the parallel orientation state, this rotation may increase the resistance value since the layer orientations are "less" parallel. Accordingly, the parallel and anti-parallel states may be distinguished by the sign of the resistance change caused by a perturbing hard axis field. The perturbing field may be imposed by an element external to the memory cell.

FIG. 3*b* shows an alternative example of a memory cell. The memory cell of FIG. 3*b* includes the structural elements of the two-conductor MTJ memory cell of FIG. 3*a*, and may further include an affect conductor 224 that runs parallel to conductor 216. The affect conductor 224 may be separated from conductor 216 by an insulating layer 226. In addition, a second affect conductor 228 may be included and may run parallel to conductor 220. Affect conductor 228 may be separated from conductor 220 by an insulating layer 230. As shown, the memory cell of FIG. 3*b* is a four-conductor configuration. A three conductor configuration may be obtained by omitting affect conductor 228.

Affect conductors 224 and 228 may be used to establish the orientation of soft magnetic layer 206. Conductors 216 and 220 may be used as sense conductors for determining the resistance of the MTJ. During a sense operation, a transient current may be passed through conductor 224 to create a perturbing hard-axis field as indicated by arrow 214. The sign of the resulting change in resistance may be used to determine the state of the MTJ.

Figure 4A:
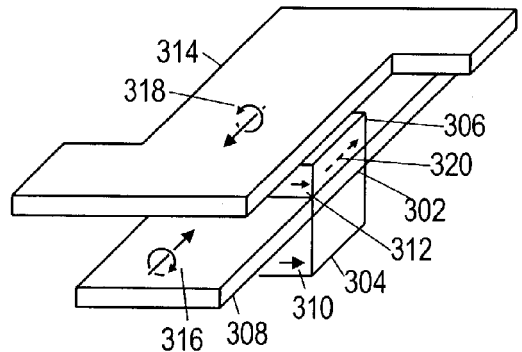
FIGS. 4a–4b show examples of giant magneto-resistive (GMR) memory elements in accordance with certain embodiments.

FIG. 4*a* shows another example of a memory cell. Unlike an MTJ, the present example includes a conductive layer 302 sandwiched between a hard magnetic layer 304 and a soft magnetic layer 306. Current flowing through conductor 308 (and consequently though layer 302) experiences a resistance that depends on the relative magnetic orientations of layers 304 and 306. The resistance of the magnetic memory cell comprising layers 304, 302 and 306 may be low when the orientations of layers 304 and 306 are aligned (as shown by arrows 310 and 312). Conversely, when the orientations the layers are opposed, the resistance of the magnetic memory cell may be high.

The easy axes of the layers may be transverse to the axis of conductors 308 and 314. The orientation of soft layer 306 may be set in the direction shown by arrow 312 by passing currents through conductors 308 and 314 in the directions shown by arrows 316 and 318, respectively. (Conductor 314 may be electrically isolated from the memory cell.) The magnetic fields around conductors 308 and 314 may combine to provide a magnetic field strength sufficient to re-orient soft layer 306, where the fields individually would be insufficient to do so. The orientation of layer 306 may be set in a direction opposite arrow 312 by reversing the currents in both conductors.

Arrow 320 shows a field along a hard axis of soft magnetic layer 306. As before, a transient hard-axis field may temporarily "rotate" the orientations of layers 304 and 306. The rotations for the hard and soft layer may be unequal. In a preferred embodiment, the rotation of the hard layer is small compared to the rotation of the soft layer). When the layers are in an anti-parallel state, the rotation may decrease the resistance since the orientations are "less" opposed. Conversely, when the layers are in a parallel state, the rotation may increase the resistance since the orientations are "less" aligned. The perturbing field may be imposed by an element external to the memory cell.

Figure 4B:
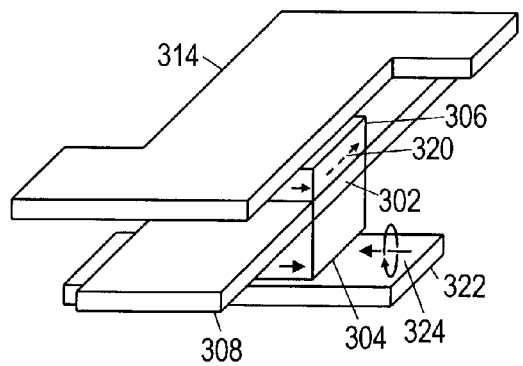

FIG. 4*b* shows yet another alternative example of a memory cell. It may include the structural elements of the memory cell in FIG. 4*a*, and may further include an affect conductor 322. Affect conductor 322 may be electrically isolated from the other components of the memory cell. A transient current passing through affect conductor 322 as shown by arrows 324 may temporarily impose a perturbing hard axis field in the direction of arrow 320. The resulting change in resistance to current flowing through conductor 308 may be used to determine the state of the memory cell.

FIG. 5a shows an electrical model for a memory cell array 102 having MTJs as memory cells. At each intersection between a row line and a column line there is a corresponding memory cell, e.g., memory cell 402 corresponds to the intersection between row line n-1 and column line k-1. Each memory cell may store data in the form of a magnetization state, and the magnetization state may be detectable as a resistance change during a read operation.

To read the contents of a memory cell, say memory cell 402, the corresponding row line may be asserted (driven to a predetermined potential) while all the other row lines are de-asserted (driven to a complementary potential). Concurrently, the corresponding column line may be de-asserted while all the other column lines are asserted. The current flowing from the corresponding row line to the corresponding column line may then be measured and monitored for changes caused by perturbations of a hard-axis field. An increase in current (which may indicate a decrease in resistance) may represent one binary value, while a decrease in current (which may indicate an increase in resistance) may represent another binary value. Other suitable sensing methods are described in U.S. Pat. Nos. 6,259,644 and 6,424,565, which are hereby incorporated by reference.

Figure 5B:

FIG. 5b shows an electrical model for an alternative memory cell 402 having an MTJ in series with a diode. The diode may be inherent in the MTJ structure or the diode may be created through extra processing steps. To read the contents of memory cell 402, the corresponding row line is asserted, and the corresponding column line is de-asserted. The current flowing to the column line may then be measured and monitored for changes caused by perturbations of a hard-axis field. An increase in current may be indicative of one binary value, while a decrease in current may be indicative of the complementary value.

Figure 5C:
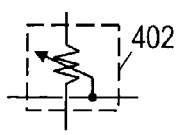

FIG. 5c shows an electrical model for an alternative memory cell 402 having the structure of FIG. 4a. To read the contents of memory cell 402, a current may be passed through the corresponding column line. The voltage drop across the column of cells may be measured and monitored for changes caused by a hard axis field perturbation to memory cell 402.

Figure 6A:
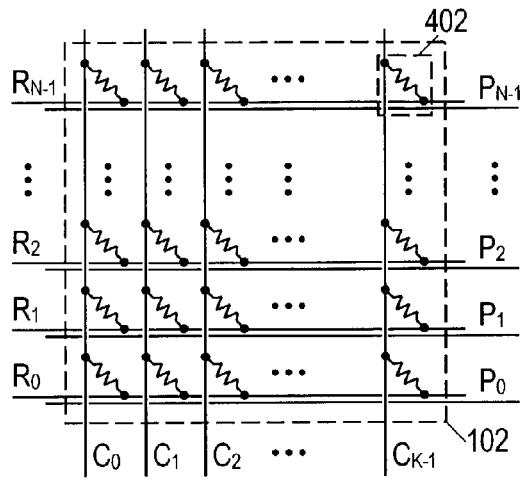
FIGS. 6a–6c show examples of electrical models of certain alternative memory cell array embodiments.
Figure 6B:
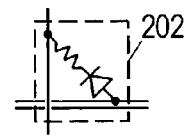
Figure 6C:
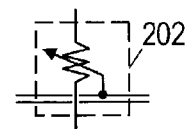

FIGS. 5a–5c show electrical models applicable to two-conductor memory cells. FIGS. 6a–6c show corresponding models for three-conductor memory cells. In FIG. 6a, three sets of lines are shown: row lines, column lines, and perturbation lines. The perturbation lines may be affect lines (previously described) paired with the row lines. The read operations described above with respect to FIGS. 5a–5c may be applied to the corresponding model in FIGS. 6a–6c. The hard-axis field perturbations described in each of the read operations may be produced by passing a transient current through the perturbation line that is paired with the corresponding row line.

Figure 7A:
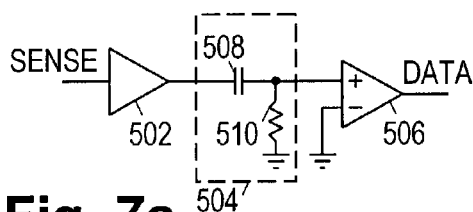
FIGS. 7a–7c show examples of certain sense circuit embodiments.

FIG. 7a shows one example of a sense circuit which may be included in support circuitry 104 to detect resistance changes caused by a hard-axis field perturbation. The sense input may be configured to receive a voltage indicative of current flowing in a column line (e.g., via a current mirror of a virtual ground). Alternatively, the sense input may be coupled to a column line to detect a voltage drop on the column line. A buffer 502 may amplify the sense signal and may provide the sense signal to a differentiator 504.

Differentiator 504 may comprise a series capacitor 508 and one or more bias resistors 510. Differentiator 504 may take a derivative of the sense signal and may provide the derivative to a comparator 506. Comparator 506 may compare the derivative to a threshold voltage (e.g., ground) and may determine if the derivative is above the threshold (positive) or is below the threshold (negative).

The output of the comparator on a clock edge may be indicative of a data value. For example, if a positive change in current or voltage is indicative of a binary "1," a positive derivative may cause comparator 506 to assert the data line as an active-high signal. Conversely, if a negative change in current or voltage is indicative of a binary "1," a negative derivative may cause comparator 506 to assert the data line as an active-low signal.

Figure 7B:
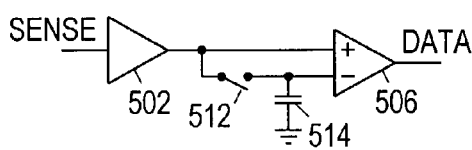

FIG. 7b shows another example of a sense circuit which may be included in support circuitry 104 to detect resistance changes caused by a hard-axis field perturbation. The differentiator is replaced with a sample-and-hold circuit and bypass. The sample and hold circuit comprises a switch 512 and a capacitor 514. During a first portion of the read operation, switch 512 is closed and capacitor 514 follows the sense signal from amplifier 502. During a second portion of the read operation, switch 512 is opened, and capacitor 514 holds a "before" sample of the sense signal, i.e., the sense signal value at the time the switch 512 is opened. Comparator 506 compares the before sample with the sense signal received via the bypass line. If the sense signal is rising, comparator 506 detects a positive difference, whereas if the sense signal is falling, comparator 506 detects a negative difference. Signal changes caused by hard-axis field perturbations can thus be detected and converted to indications of stored digital data.

Figure 7C:
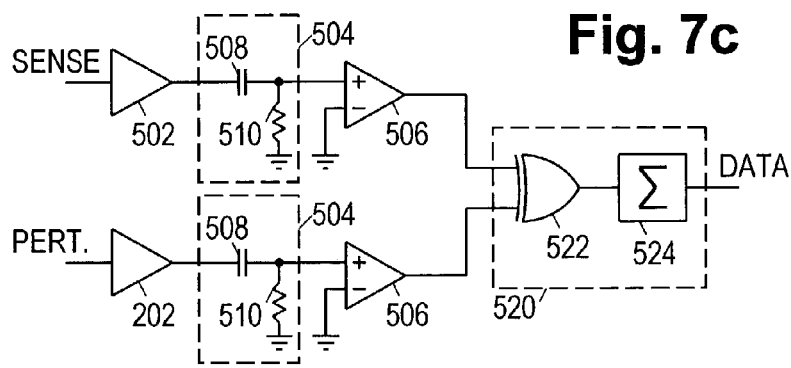

FIG. 7c shows yet another example of a sense circuit which may be included in support circuitry 104 to detect resistance changes caused by a hard axis field perturbation. The sense circuit includes two copies of the sense circuit of FIG. 7a. One copy receives the sense input, while the other copy receives the perturbation signal (e.g., a voltage indicative of a current flowing in an affect conductor). The outputs of each sense circuit may be "high" when the signal derivative is positive, and may be "low" when the signal derivative is negative.

If an increase in the hard-axis perturbation (caused by an increase in the perturbation signal) leads to an increase in current, the two derivatives may be in phase with each other. Conversely, if the increase in hard-axis perturbation leads to a decrease in current, the two derivatives may be 180 degrees out-of-phase with each other. A phase detector 520 may be used to determine the phase relationship between the sense signal and the perturbation signal.

A significant increase in signal-to-noise ratio (SNR) may be achieved by making the perturbation signal an alternating signal that cycles multiple times during a read operation. Accordingly, the phase detector may include an exclusive-or (XOR) gate 522 and a counter 524. An out-of-phase relationship may be indicated by an asserted output from XOR gate 522, and an in-phase relationship may be indicated by a de-asserted output from XOR gate 522. Counter 524 may combine multiple values from gate 522 to reduce any probability of error. If the counter exceeds a predetermined threshold, an out-of-phase relationship may be determined, and the data line may be asserted accordingly. Counter 524 may be reset after each read operation.

Figure 8:
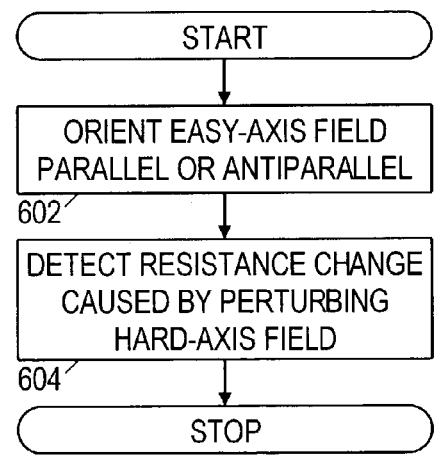
FIG. 8 shows a flow diagram for an example of certain method embodiments.

FIG. 8 shows a flow diagram of a read method for magnetic integrated memories. In block 602, data may be stored in a magnetic memory cell. The storing operation may involve suitably orienting an easy-axis magnetization of a magnetic layer parallel or anti-parallel to the persistent magnetization of a second magnetic layer. At some subsequent time, the data may be read from the magnetic memory cell as indicated by block 604. In block 604, a measurement may be performed to detect a resistance change caused by perturbing a hard-axis field of one or both of the magnetic layers. The sign of the resistance change may be indicative of the stored data.

The above-described hard-axis perturbation technique may be applied to a host of magnetic integrated memory technologies including ferromagnetic memory (FRAM), spin-dependent tunneling (SDT) memory, pseudo-spin valve resistance (PSV) memory, crosstie memory (CRAM), memories employing anisotropic magneto-resistance (AMR) materials, giant-magneto-resistance (GMR) sensors, induction sensors, hall-effect sensors, and more.

The above discussion is meant to be illustrative of the principles and various embodiments of the present invention. Numerous variations and modifications will become apparent to those skilled in the art once the above disclosure is fully appreciated. The terms row and column may be exchanged throughout the discussion above. Though two, three, and four conductor architectures have been described, the principles described herein may be readily applied to architectures having architectures with different numbers and arrangements of conductors. It is intended that the following claims be interpreted to embrace all such variations and modifications.

What is claimed is:

1. A method of retrieving data stored in a magnetic integrated memory, the method comprising:
    applying a perturbing hard-axis magnetic field to a giant magneto-resistive (GMR) memory element in a magnetic integrated memory; and
    detecting a change in an electrical parameter caused by said perturbing hard-axis magnetic field.

2. The method of claim 1, wherein the electrical parameter is selected from a group consisting of resistance, current, and voltage.

3. The method of claim 1, further comprising:
    determining a stored data value based on whether the change is above or below a predetermined threshold.

4. The method of claim 1, further comprising:
    determining a stored data value based on whether the change is in-phase or out-of-phase with a signal representing the perturbing hard-axis magnetic field.

5. A memory comprising:
    an array of memory cells organized in columns and rows, each memory cell having a hard magnetic layer and a soft magnetic layer separated by a conductive layer;
    a sense line that couples said conductive layers in a column of memory cells in series;
    an affect line configured to perturb a magnetic field along hard axes of magnetic layers in a row of memory cells during a nondestructive read operation; and
    a sense circuit coupled to the sense line to detect a change in resistance induced by the affect line during said read operation.

6. The memory of claim 5, wherein the sense circuit determines a digital value stored in a memory cell based on the sign of the change in resistance.

7. The memory of claim 5, wherein the sense circuit is further coupled to the affect line to detect a perturbation current, and wherein the sense circuit determines a digital value stored in a memory cell based on the relative phase between the change in resistance and the perturbation current.

8. The memory of claim 5, wherein the affect line carries at least two current pulses during each read operation of a memory cell in that row.

9. The memory of claim 8, wherein the sense circuit combines change measurements corresponding to the at least two current pulses to determine a digital value stored in a memory cell.

10. A method of retrieving data stored in a magnetic integrated memory, the method comprising:
    applying an alternating hard-axis magnetic field to a magnetic element in a magnetic integrated memory; and
    detecting an alternating change in an electrical parameter caused by said alternating hard-axis magnetic field.

11. The method of claim 10, further comprising:
    determining a stored data value based on whether the alternating change is in-phase or out-of-phase with the alternating hard-axis magnetic field.

12. The method of claim 11, wherein said determining includes accumulating change information over multiple cycles of the alternating hard-axis magnetic field.

13. The method of claim 10, wherein the magnetic element is part of a memory cell that stores a data value as a persistent magnetization that is parallel or anti-parallel to a persistent magnetization of a second magnetic element associated with the memory cell.

14. The method of claim 13, wherein the magnetic element and the second magnetic element are separated by a nonconductive layer.

15. The method of claim 13, wherein the magnetic element and the second magnetic element are separated by a conductive layer.

* * * * *